United States Patent
Fijany et al.

(10) Patent No.: US 7,514,964 B2
(45) Date of Patent: Apr. 7, 2009

(54) UNIVERSAL PROGRAMMABLE LOGIC GATE AND ROUTING METHOD

(75) Inventors: Amir Fijany, Pasadena, CA (US); Farrokh Vatan, West Hills, CA (US); Kerem Akarvardar, Grenoble Cedex (FR); Benjamin Blalock, Knoxville, TN (US); Suheng Chen, Knoxville, TN (US); Sorin Cristoloveanu, Grenoble Cedex (FR); Elzbieta Kolawa, Bradbury, CA (US); Mohammad M. Mojarradi, La Canada, CA (US); Nikzad Toomarian, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 129 days.

(21) Appl. No.: 11/377,935

(22) Filed: Mar. 15, 2006

(65) Prior Publication Data

US 2007/0008013 A1    Jan. 11, 2007

Related U.S. Application Data

(60) Provisional application No. 60/663,103, filed on Mar. 18, 2005, provisional application No. 60/678,006, filed on May 4, 2005.

(51) Int. Cl.
 *H03K 19/20*    (2006.01)
 *G11C 7/00*    (2006.01)
(52) U.S. Cl. ............................ 326/104; 377/64; 377/69; 365/200; 365/225.7
(58) Field of Classification Search ................. 326/104; 377/75, 64; 365/200, 225.7
 See application file for complete search history.

(56) References Cited

U.S. PATENT DOCUMENTS 5,543,643 A * 8/1996 Kapoor ....................... 257/262
6,180,984 B1   1/2001 Golke et al. ................ 257/347

OTHER PUBLICATIONS

K. Akarvardar et al. IEEE 2006. Low-Frequency Noise in SOI Four-Gate Transistors, pp. 1-7.*
S. Cristoloveanu, Journal of The Korean Physical Society, vol. 45, No. 5, Nov. 2004, pp. 1189-1192.*
Blalock. B.J., et al., "The Multiple Gate MOS-JFET Transistor," Int. Journal of High Speed Electronics and Systems, 12, 2, pp. 511-520 (2002), month unk.
Cristoloveanue, B., et al., "The Four-Gate Transistor," Proceedings of the 2002 European Solid-State Device Research Conf., pp. 323-326 (2002), month unk.
Dufrene, B., et al., "Investigation of the Four-Gate Action in $G^4$-FETs,"IEEE Trans. On Electron Devices, 51, 11, pp. (Nov. 2004).
Fang, S., et al., "Constrained via minimization with practical considerations for multi-layer VLS/PCB routing problems," ACM/IEEE Design Automation Conference, pp. 60-65 (1991), month unk.

(Continued)

*Primary Examiner*—Vibol Tan
(74) *Attorney, Agent, or Firm*—Ladas & Parry LLP

(57) ABSTRACT

An universal and programmable logic gate based on $G^4$-FET technology is disclosed, leading to the design of more efficient logic circuits. A new full adder design based on the $G^4$-FET is also presented. The $G^4$-FET can also function as a unique router device offering coplanar crossing of signal paths that are isolated and perpendicular to one another. This has the potential of overcoming major limitations in VLSI design where complex interconnection schemes have become increasingly problematic.

3 Claims, 8 Drawing Sheets

OTHER PUBLICATIONS

Fijany, A., et al., "The $G^4$-FET: A Universal and Programmable Logic Gate," GLSVLSI '05, (Apr. 17-19, 2005).

Gao, M.H., et al., "Single device: inverter using SOI corss-MOSFETS," Proc. IEEE Int.SOI Conf., p. 138 (1991), month unk.

Greenberg, R., et al., "On the Difficulty of Manhattan Channel Routing," Information Processing Letters, vol. 44, No. 5, pp. 281-284 (1992), month unk.

* cited by examiner

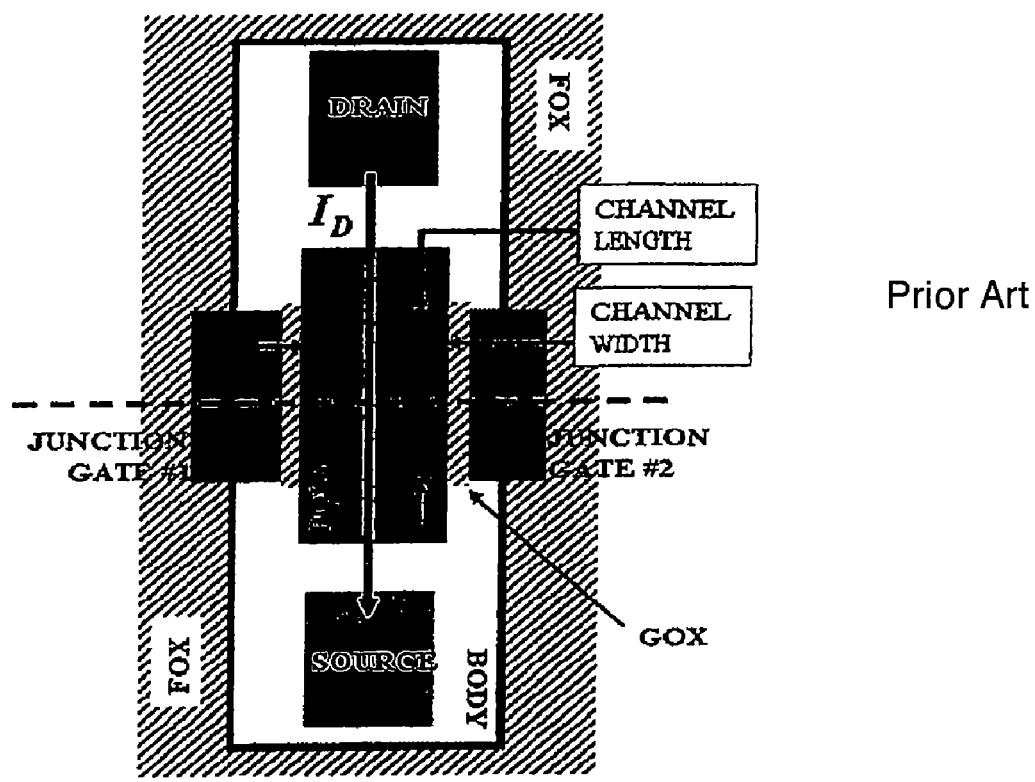
Prior Art
FIG. 1
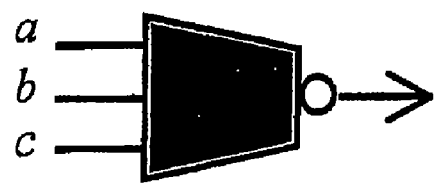
FIG. 2A
| a | b | c | output |
|---|---|---|--------|
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |
FIG. 2B

| a | b | $c_{in}$ | s | $c_{out}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |
FIG. 8
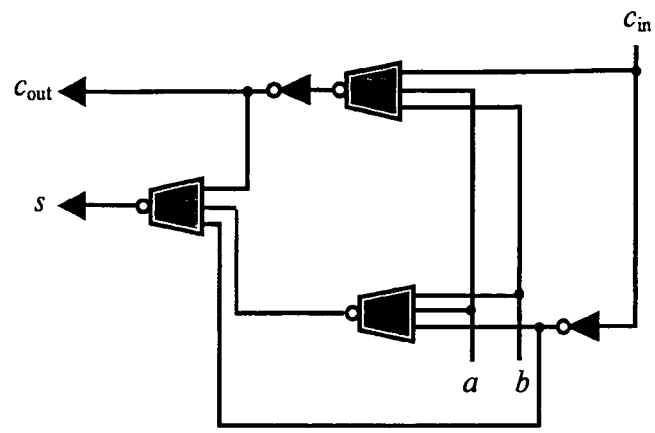
FIG. 9A
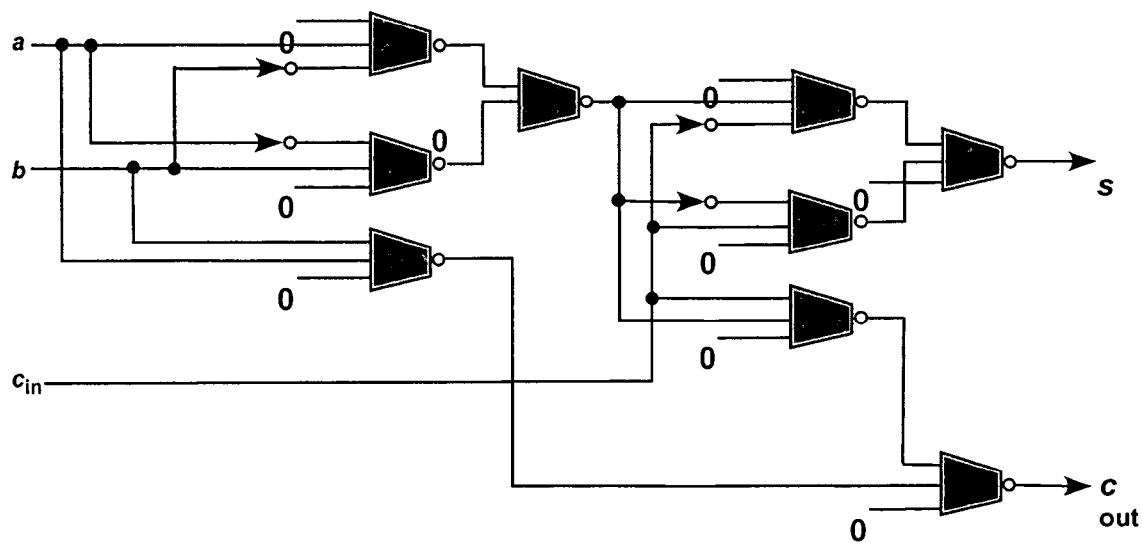
FIG. 9B

$$\text{PARITY}_n(\chi_1, \chi_2,...,\chi_n) = \chi_1 \oplus \chi_2 \oplus \cdots \oplus \chi_n$$

$$= \begin{cases} 1 & \text{if number of 1's in } (\chi_1, \chi_2,...,\chi_n) \text{ is odd} \\ 0 & \text{if number of 1's in } (\chi_1, \chi_2,...,\chi_n) \text{ is even} \end{cases}$$

for example, $$\text{PARITY}_5(1,0,0,1,1) = 1$$
$$\text{PARITY}_5(1,0,0,1,0) = 0$$

UNIVERSAL PROGRAMMABLE LOGIC GATE AND ROUTING METHOD

CROSS-REFERENCE TO RELATED APPLICATIONS

This application claims the benefit of U.S. provisional Patent Application Ser. No. 60/663,103, filed Mar. 18, 2005 for "A Universal and Programmable Logic Gate" by Travis W Johnson, Amir Fijany, Mohammad M Mojarradi, Farrokh Vatan, Nikzad Toomarian, Elzbieta A Kolawa, Sorin Cristoloveanu and Benjamin Blalock, and also claims the benefit of U.S. provisional Patent Application Ser. No. 60/678,006 filed May 4, 2005 for "Efficient Routing Method by $G^4$-FET Gates" by Amir Fijany, Farrokh Vatan, Mohammad M Mojarradi, Nikzad Toomarian, Travis W Johnson, Elzbieta A Kolawa, Benjamin Blalock, Sorin Cristoloveanu, Suheng Chen and Kerem Akarvardar, the disclosure of all of which is incorporated herein by reference.

FEDERAL SUPPORT

The invention described herein was made in the performance of work under a NASA contract, and is subject to the provisions of Public Law 96-517 (35 USC 202) in which the Contractor has elected to retain title. The U.S. Government has certain rights in this invention.

BACKGROUND

1. Field

The present application relates to electronic devices and methods. In particular, it relates to applications of a $G^4$-FET, such as the $G^4$-FET as a universal and programmable logic gate and an efficient routing method by $G^4$-FET devices.

2. Related Art

The $G^4$-FET [References 1-3 and U.S. Pat. No. 6,180,984 to Golke] is a remarkable transistor in that it features the maximum number of gate terminals that can be conceived for unprecedented (by previous transistor structures) control of the conduction channel. Based on a MOSFET structure in partially depleted SOI CMOS, the $G^4$-FET exhibits multiple behavioral personalities afforded this structure to achieve a single-transistor logic device. The attractiveness of the $G^4$-FET as a logic device comes from the unique opportunity to independently command four separate transistor input terminals.

SUMMARY

According to a first aspect, a logic gate having three inputs and one output is provided, the output having a first logic value when at least two of the three inputs have a second logic value different from said first logic value, wherein said logic gate is a four-gate field emitter transistor ($G^4$-FET).

According to a second aspect, a four-gate field emitter transistor ($G^4$-FET) having three inputs and one output is provided, wherein the three inputs are connected therebetween and adapted to receive the same input logic value, whereby the $G^4$-FET acts as an inverter of said input logic value.

According to a third aspect, a four-gate field emitter transistor ($G^4$-FET) having three inputs and one output is provided, wherein two of the three inputs are connected therebetween and adapted to receive the same input logic value, whereby the $G^4$-FET acts as a logic inverter of said input logic value.

According to a fourth aspect, a four-gate field emitter transistor ($G^4$-FET) having three inputs and one output is provided, wherein a first input receives a first logic value, a second input receives a second logic value, and a third input receives a third logic value different from the second logic value, whereby the $G^4$-FET acts as a logic inverter of said first logic value.

According to a fifth aspect, an AND logic gate is provided, comprising: a first four-gate field emitter transistor ($G^4$-FET) having three inputs and one output; and a second $G^4$-FET having three inputs and one output, wherein: one of the inputs of the first $G^4$-FET has a low logic value; a first input of the second $G^4$-FET has a logic value which is opposite to a logic value of a second input of the second $G^4$-FET; and a third input of the second $G^4$-FET is connected to the output of the first $G^4$-FET.

According to a sixth aspect, an AND logic gate is provided, comprising: a four-gate field emitter transistor ($G^4$-FET) having three inputs and one output; and an inverter connected to the output of the $G^4$-FET, wherein one of the inputs has a low logic value.

According to a seventh aspect, an OR logic gate is provided, comprising: a first four-gate field emitter transistor ($G^4$-FET) having three inputs and one output; and a second $G^4$-FET having three inputs and one output, wherein: one of the inputs of the first $G^4$-FET has a high logic value; a first input of the second $G^4$-FET has a logic value which is opposite to a logic value of a second input of the second $G^4$-FET; and a third input of the second $G^4$-FET is connected to the output of the first $G^4$-FET.

According to an eighth aspect, an OR logic gate is provided, comprising: a four-gate field emitter transistor ($G^4$-FET) having three inputs and one output; and an inverter connected to the output of the $G^4$-FET, wherein one of the inputs has a high logic value.

According to a ninth aspect, a four-gate field emitter transistor ($G^4$-FET) having three inputs and one output is provided, wherein one of the inputs acts as a control bit to generate a programmable 2-bit gate.

According to a tenth aspect, a full adder for adding three one-bit binary numbers a, b, cin and outputting two one-bit binary numbers s and cout is provided, the full adder comprising: a first four-gate field emitter transistor ($G^4$-FET) having three inputs and one output; a second four-gate field emitter transistor ($G^4$-FET) having three inputs and one output; and a third four-gate field emitter transistor ($G^4$-FET) having three inputs and one output, wherein: a and b are input to the first $G^4$-FET and the second $G^4$-FET; cin is input to the first $G^4$-FET and cin inverted is input to the second $G^4$-FET and the third $G^4$-FET; the output of the second $G^4$-FET is input to the third $G^4$-FET; an inverted output of the first $G^4$-FET represents cout and is input to the third $G^4$-FET; and the output of the third $G^4$-FET represents s.

According to an eleventh aspect, a circuit for computing a parity function of three signals is provided, comprising: a first four-gate field emitter transistor ($G^4$-FET) having three inputs and one output; a second four-gate field emitter transistor ($G^4$-FET) having three inputs and one output; a third four-gate field emitter transistor ($G^4$-FET) having three inputs and one output, wherein: a first signal is arranged to be input to the second $G^4$-FET and an inverted first signal is input to the first $G^4$-FET; a second signal is arranged to be input to the first $G^4$-FET and an inverted second signal is input to the second $G^4$-FET; a third signal is arranged to be input to the first, second and third $G^4$-FET; the output of the first $G^4$-FET is connected to an input of the third $G^4$-FET; and the output of the second $G^4$-FET is connected to an input of the third $G^4$-FET, the output of the third $G^4$-FET representing the parity function.

According to a twelfth aspect, a method for operating a four-gate field emitter transistor ($G^4$-FET) is provided, the $G^4$-FET comprising an inversion mode MOSFET and an accumulation mode MOSFET, the method comprising a step of operating the $G^4$-FET as a signal routing device by simultaneously operating the inversion mode MOSFET in a lateral direction and the accumulation mode MOSFET in a perpendicular direction.

According to a thirteenth aspect, a method for operating a plurality of four-gate field emitter transistors ($G^4$-FETs) is provided, comprising: operating a first subset of said $G^4$-FETs as computational devices; and operating a second subset of said $G^4$-FETs as routing devices.

According to a fourteenth aspect, a circuit comprising computational devices and routing devices is provided, wherein both said computational devices and said routing devices comprise four-gate field emitter transistors ($G^4$-FETs).

In the present application, the computational behavior of $G^4$-FET as a logic device is disclosed. The applicants will show that the logic function the $G^4$-FET implements is the inverse of the Majority gate (the output of the Majority gate is '1' if more than half of its inputs are '1'). Therefore, the applicants refer to the $G^4$-FET as a Not-Majority gate. The applicants will also show that the $G^4$-FET is a universal logic gate, capable of emulating any basic logic function. The Applicants will also show that the $G^4$-FET can be used as a programmable gate by using one of its inputs as a control bit. The universal and programmable functionality of the $G^4$-FET enables novel and more efficient (in terms of number of Boolean gates) logic circuits. As an example, the Applicants provide the design of a $G^4$-FET based full adder circuit and a circuit for computing the Parity function that are significantly more efficient than conventional designs.

The $G^4$-FET can also function as a unique router device offering coplanar crossing of signal paths that are isolated and perpendicular to one another. This has the potential of overcoming major limitations in VLSI design where complex interconnection schemes have become increasingly problematic.

BRIEF DESCRIPTION OF THE FIGURES

FIG. 1 shows a top view of a $G^4$-FET device.

FIG. 2A shows a schematic diagram of a $G^4$-FET device and FIG. 2B shows the truth table of a $G^4$-FET device.

FIGS. 8, 9A and 9B show the truth table and the structure of two embodiments of a full adder using $G^4$-FET devices.

DETAILED DESCRIPTION

FIG. 1 depicts an n-channel $G^4$-FET. The $G^4$-FET is constructed from a p-channel MOSFET structure on partially-depleted SOI CMOS technology that has two independent body contacts, one on each side. These body contacts are used as source and drain for the transversal n-channel JFET associated with the structure. The standard MOSFET structure's source and drain are promoted as lateral junction gates for the transversal JFET and used to modulate the conductive path. The maximum extension of the conductive path corresponds to the gate length of the original MOSFET, whereas the JFET channel length is defined by adjusting the width of the MOSFET. Thus, $G^4$-FET gate length is defined by MOFSET drawn gate width and $G^4$-FET gate width is determined by MOSFET drawn gate length. Multiple gate fingers can be readily added in layout to increase the $G^4$-FET's total gate width. No specialized processing is required to manufacture the device.

The $G^4$-FET's operational characteristics have been presented in [References 1-3]. As shown in FIG. 1, the channel of the $G^4$-FET is within the body of the drawn MOSFET structure. Thus, an inversion-mode p-channel MOSFET structure provides an accumulation/depletion-mode n-channel $G^4$-FET. The $G^4$-FET's drain current is composed of majority carriers and flows in a perpendicular direction to that of what would be an inversion-mode MOSFET. The top poly gate and the back gate (substrate) can still be used to modulate the channel current through MOS field effect. The lateral junction gates have a JFET like action, narrowing the channel and modulating the effective doping. Control of the $G^4$-FET's conduction channel will be further enhanced with CMOS technology scaling as the separation between the two junction-gates shrinks.

FIG. 2B describes the logical function of $G^4$-FET gate. Note that this is a 3-input gate, as also shown in FIG. 2A.

To describe the function of this gate in terms of known Boolean functions, first note that the output of a Majority gate is 1 if more than half of its inputs are 1. Thus the function of the $G^4$-FET, as a logic device, is indeed the inverse of a majority gate and hence it is a Not-Majority gate.

Figure 3:
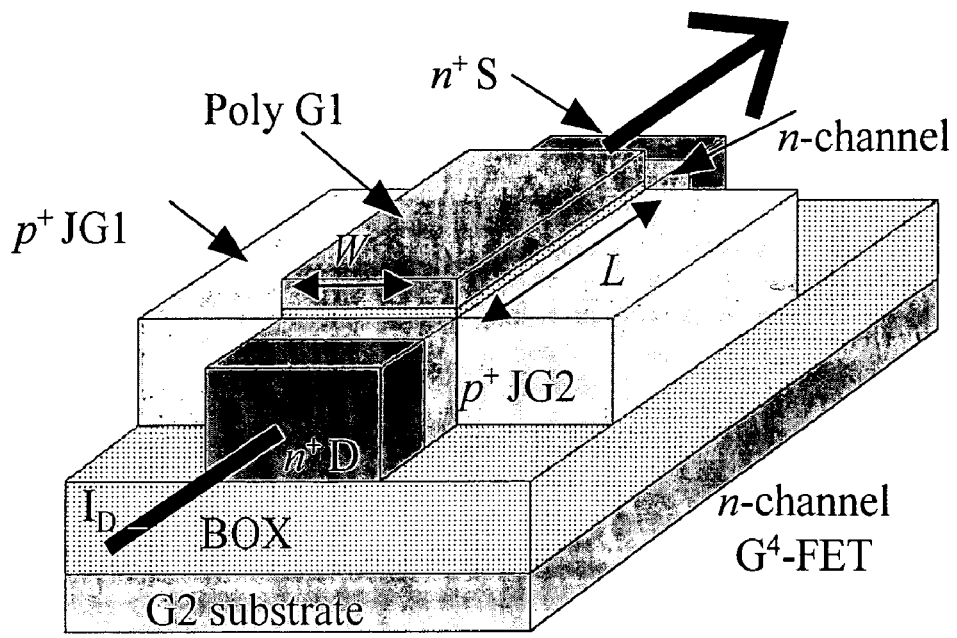
FIG. 3 shows a perspective view of the $G^4$-FET structure.

Two parameters of the $G^4$-FET, which are critical to its operation as a Not-Majority gate, are its width W and length L. These parameters are defined in FIG. 3. A specific $W_{min}$ is required to ensure that the switching on $G^4$-FET logic device can only be switched 'on' when any two of its inputs are 'high'. For W less than this value, a logic high input at any one of its three inputs can turn on the $G^4$-FET. However a maximum W will determine if it is possible to switch the state of the $G^4$-FET. If W is too large, then none of the inputs can cause the $G^4$-FET to switch states. The parameter L determines the current handling capability of the $G^4$-FET, where L is inversely proportional with the current of the $G^4$-FET. Therefore, smaller L will reduce the switching speed of the logic circuit.

The voltage levels required for turning off switching the output state of the $G^4$-FET logic device are also function of the device size, JFET switching voltages are not the same as the voltage level for the switching of the poly gate. Level translators are necessary to convert the output voltage level of the logic stage to input level of the next stage. These level translators are already included in the circuit of FIG. 1.

Figure 4:
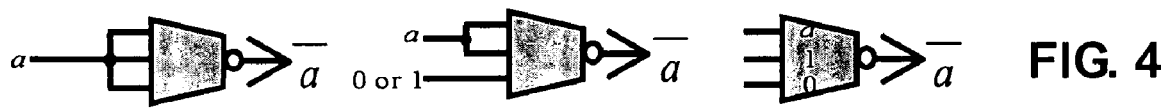
FIGS. 4-6 show NOT, AND and OR functions using $G^4$-FET devices.
Figure 5:
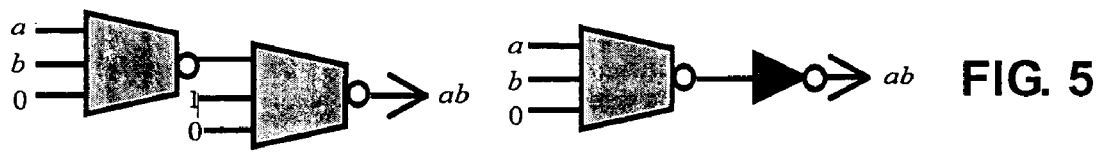
Figure 6:
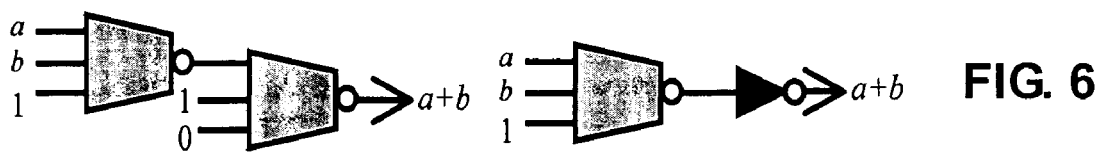

To explore the computational power of the $G^4$-FET logic device, the Applicants first demonstrate the implementation of the basic Boolean gates by using $G^4$-FET gate. FIG. 4 shows three ways to implement a NOT gate (inverter) by using $G^4$-FET. FIG. 5 shows two ways to implement an AND gate by using $G^4$-FET. FIG. 6 shows two ways to implement an OR gate by using $G^4$-FET.

The above constructions clearly show that the $G^4$-FET (by itself) is a universal gate, since either of the sets {Not, AND} or {Not, OR} is universal. This means that, in principal, the $G^4$-FET logic device is capable of performing any computation.

Figure 7:
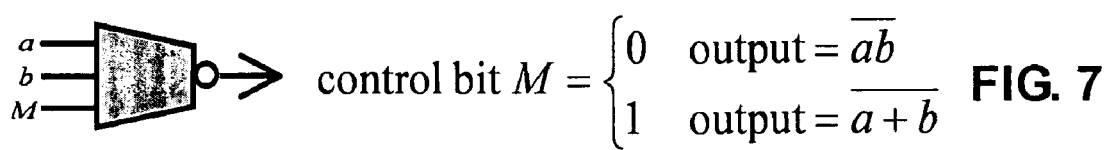
FIG. 7 shows the $G^4$-FET as a programmable gate.

One of the advantages of the $G^4$-FET structure as a logic gate is that one of its three inputs can be used as a control bit to generate a programmable 2-bit gate. As seen in FIG. 7, by fixing the control bit to 0 or 1, the $G^4$-FET logic device acts as a NAND or NOR gate, respectively. This is another indication that $G^4$-FET is a universal logic gate, just as NAND and NOR are such gates.

The full-adder circuit adds three one-bit binary numbers (a, b, $c_{in}$) and outputs two one-bit binary numbers: sum (s) and carry ($c_{out}$), according to the table shown in FIG. 8.

FIG. 9A shows an implementation of the full adder by using 3 $G^4$-FET logic devices and 2 inverters. Note that, to the best of our knowledge, the best implementation of full adder based on basic Boolean gates, uses 9 NAND gates and 4 inverters.

Analyzing the behavior of this circuit reveals the power of the programmable $G^4$-FET logic device. The fact that the functionality of this gate switches between NAND and NOR, depending on the values of its inputs, makes it possible to implement the full adder with a significantly smaller numbers of gates.

FIG. 9B shows a further embodiment of a full adder in accordance with the present disclosure, where nine $G^4$-FET devices with constant mode inputs are used.

Figures 10, 11:
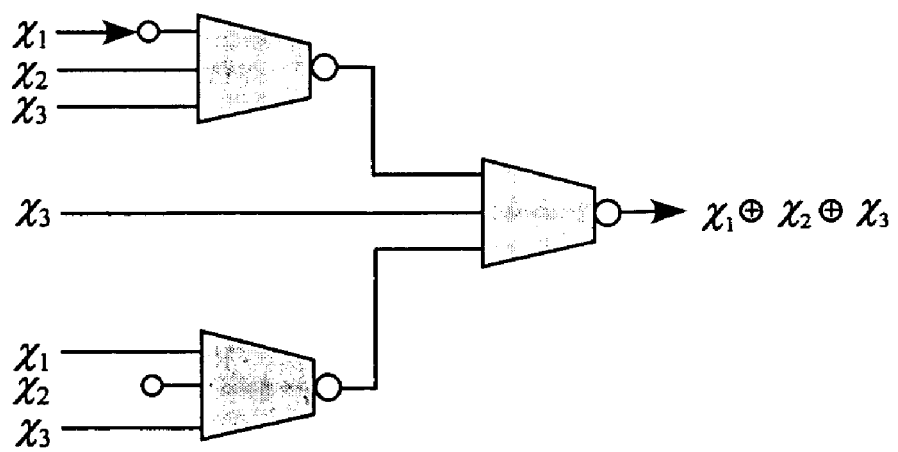
FIG. 10 shows a definition of a parity function.
FIG. 11 shows a parity function circuit comprising $G^4$-FET devices.

In accordance with the present disclosure, circuits based on $G^4$-FET devices for parity functions are provided. A parity function is defined in FIG. 10. FIG. 11 shows a parity function based on $G^4$-FET devices. Only three $G^4$-FET devices are required. A recursive contruction provides a $G^4$-FET based circuit for the function parity(n) with 3(n−1)/2 devices and 2(n−1)/2 inverters. Thus, this circuit needs at most 11n transistors. On the contrary, the optimal NOR-based circuit for the parity(n) function requires 4(n−1) NOR gates, for a total of 16n-4 transistors.

As also explained in the introductory section of the present application, the $G^4$-FET can also function as a unique router device offering coplanar crossing of signal paths that are isolated and perpendicular to one another.

VLSI technology has made possible the integration of many functional components (processors, memory, etc.) into a single chip. In VLSI design, memory and processing are relatively cheap and the main emphasis of the design is on reducing the overall interconnection complexity since data routing costs dominate the power, time, and area required to implement computation. Communication between functional components is costly because wires occupy the most space within a VLSI system and tend to dictate the achievable clock speed. In fact, much of the complexity (and hence the cost) of VLSI design results from minimization of data routing. The main difficulty in VLSI routing is that the crossing of the lines carrying data, instruction, control, etc., is not possible in a single plane of the VLSI chip. At present, wherever two separate wires in a VLSI circuit must cross each other, the wires must not be in the same plane; that is, there must be a layer of electrical insulation between them. Moreover, it is well known that the optimization of VLSI routing is a very computationally challenging problem and, in fact, different versions of this problem are intractable, e.g., [Reference 4].

The basic challenge of VLSI design is that as the number of devices increases, the number of interconnections as well as the area used for these interconnections increases. Due to the dominance of interconnect in the overall delay on chip, today's floorplanning techniques also try to minimize global connectivity and critical net lengths. The current VLSI technology solution for this is to introduce additional layers for interconnections. Technologies with as much as seven metal layers are commercially available today [Reference 5]. But this development has introduced several new problems and has led to extensive research on how to improve the efficiency of current routing algorithms. A summary of these problems is given in [Reference 6]:

Interconnection delays: as technology scaling continues to provide faster transistors and therefore faster logic gates with each process generation, the number of interconnects and the length of those interconnects has increased as well, to the point where interconnect delay can exceed gate delay.

Three dimensional routing: the increased number of interconnection layers provides more freedom in routing and three dimensional routing techniques are necessary to take advantage of the extra connection layers.

Generally a connection between the interconnect layers is achieved using a via. Vias are unavoidable if more than one layer is used for routing, and the problems associated with their usage include the following [Reference 7]:

Increasing the number of vias on a chip reduces the probability that the chip will be properly fabricated, therefore reducing yield.

Every via has an associated resistance (more than the layers it is connecting) that affects the circuit performance.

The size of the via is usually larger than the width of the wires. As a result, vias increase routing space.

Successful completion rate of routing synthesis within a VLSI system is inversely proportional to the required number of vias.

Therefore minimizing the number of vias is a challenging optimization problem facing VLSI design.

In the present application, the applicants disclose the unique capability of the $G^4$-FET to function as a via to enable coplanar crossing of signal paths. This capability has the potential of alleviating data routing constraints facing VLSI design since it would enable compact implementation of complex interconnection wiring within a plane that has not been previously possible. The Applicants believe that the $G^4$-FET could potentially open a new direction for efficient VLSI design by enabling coplanar signal crossing.

Figure 12:
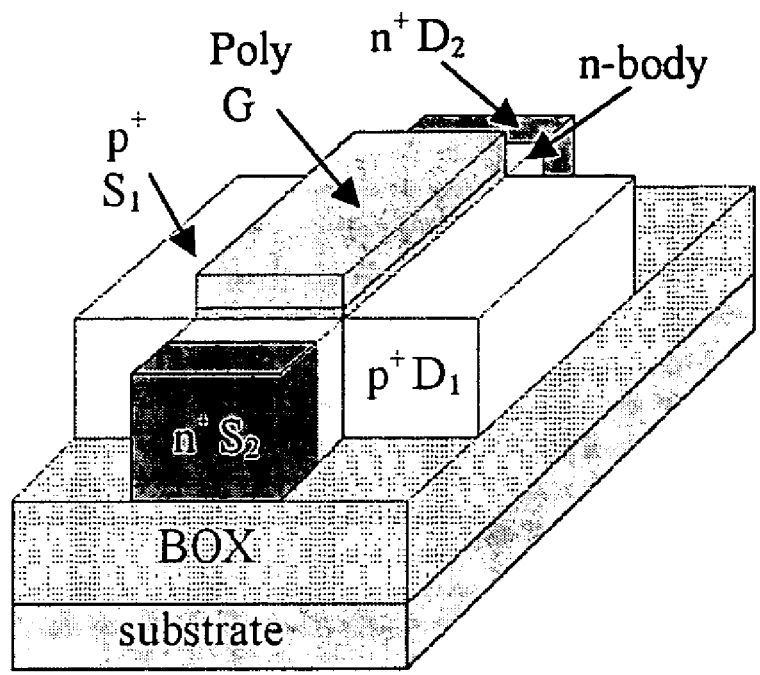
FIG. 12 shows a further perspective view of the $G^4$-FET structure, similar to the one of FIG. 3.

FIG. 12 shows a perspective view of the $G^4$-FET. The $G^4$-FET is an SOI 4-gate transistor [References 2 and 3] that has the same basic structure as the SOI cross-MOSFET used to construct a singe device inverter in [Reference 8], though the cross-MOSFET is somewhat wider. The operation of the SOI cross-MOSFET is based on the sequential use of the inversion-mode and the accumulation-mode MOSFETs, sharing the gate and substrate terminals.

In the present application, the $G^4$-FET is used as a signal routing device by the simultaneous operation of the inversion-mode MOSFET in the lateral direction and the accumulation-mode MOSFET in the perpendicular direction. Both static and dynamic measurements of the $G^4$-FET as a routing device will be shown.

Figure 13:
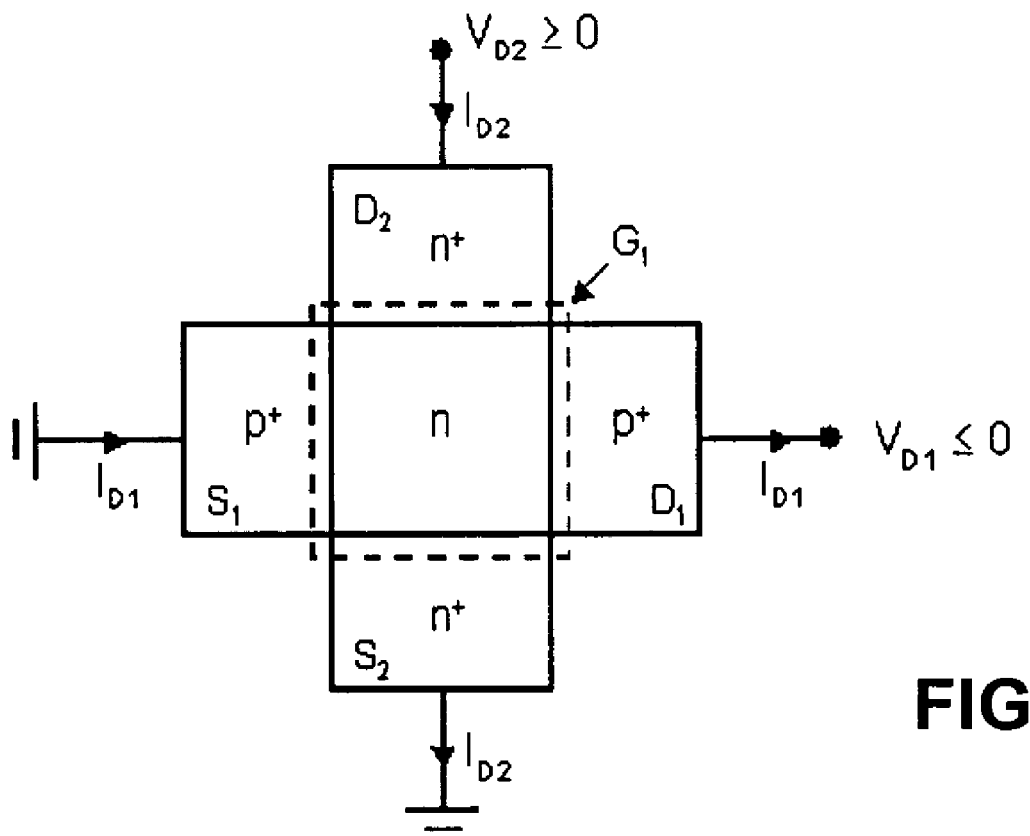
FIG. 13 shows a DC configuration of the SOI router in accordance with the present disclosure.

FIG. 13 shows the DC configuration of the router: the drain of the inversion mode p-channel MOSFET is biased to $V_{D1}$ and the drain of the accumulation-mode n-channel MOSFET is biased to $V_{D2}$ while the source terminal of both transistors ($S_1$ and $S_2$) are grounded.

Figure 14A:
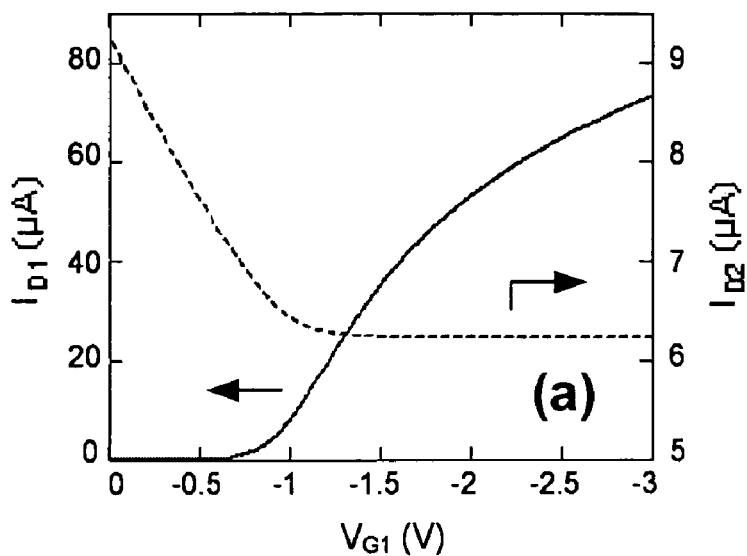
FIGS. 14A-14C show simultaneous drain current variation of an inversion-mode partially-depleted PMOSFET and a buried-channel NMOSFET as a function of front-gate voltage, $V_G$ ($V_{D1}$=−0.1 V, $V_{D2}$=1.25 V) as shown in FIG. 14A, drain voltage, $V_{D1}$ ($V_G$=−1 V, $V_{D2}$=1.25 V) as shown in FIG. 14B, and drain voltage, ($V_G$=−1 V, $V_{D1}$=−50 mV) as shown in FIG. 14C.
Figure 14B:
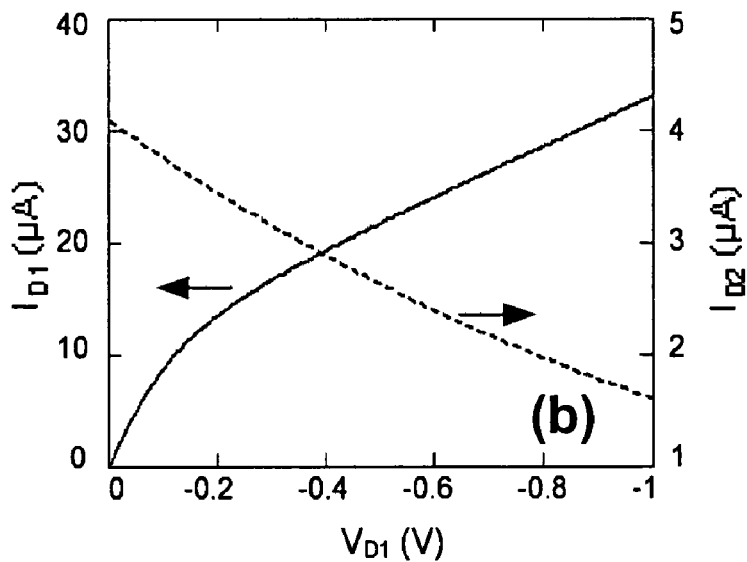
Figure 14C:
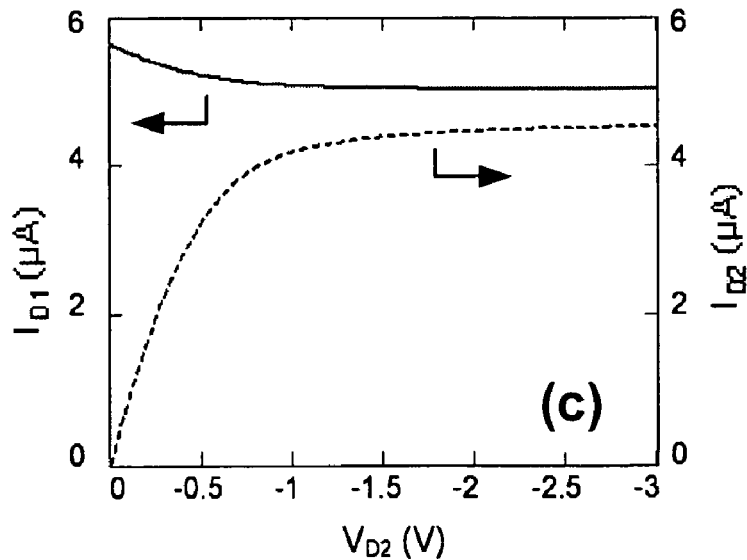

As experimentally demonstrated in FIGS. 14A-14C, the two drain currents $I_{D1}$ and $I_{D2}$ (that are perpendicular to each other) may flow at the same time. $I_{D1}$ depends on the minority carriers and flows at the surface in lateral direction while $I_{D2}$ depends on majority carriers and flows in the middle of the silicon film volume in the perpendicular direction. Surface holes and bulk electrons do not recombine since the front-gate induced depletion region isolates them. The top-gate can modulate both currents (FIG. 14A): $I_{D1}$ is controlled through regular MOS action while $I_{D2}$ is modulated by the vertical depletion width modulation. $I_{D2}$ can be weakly modulated also by $V_{D1}$ (FIG. 14B) and vice-versa (FIG. 14C). The $I_{D1}$ ($V_{D2}$) dependency is explained by the fact that the body voltage of the PMOSFET is changing between 0 V and $V_{D2}$, which means that the threshold voltage of the PMOS increases in the $S_2$ to $D_2$ direction. When $I_{D2}$ saturates, this dependency vanishes (FIG. 14C) because any $V_{D2}$ increase beyond the saturation voltage drops basically in the pinch-off region. On the other hand, as $V_{D1}$ becomes more negative, the $D_1$/body junction depletion region extends more into the body, decreasing the channel width and drain current ($I_{D2}$) of the NMOS (FIG. 14B).

The router operation is tested by simultaneously applying "signals" to drains $D_1$ and $D_2$ and by probing $S_1$ and $S_2$, which are then left floating. Due to the strong length-width asymmetry of the structure (for PMOS: W=3.4 µm, L=0.35 µm), $I_{D2}$ was much lower than $I_{D1}$ and was unable to drive the probe capacitance. Therefore it had to be supported by the extra electrons accumulated at the back interface by applying 40V to the substrate. $V_{D1}$ and $V_{D2}$ were 1 V peak-to-peak square-waves with −1 V and 1 V offset, respectively. The front surface was kept in strong inversion with $V_G$=−3 V.

Figure 15:
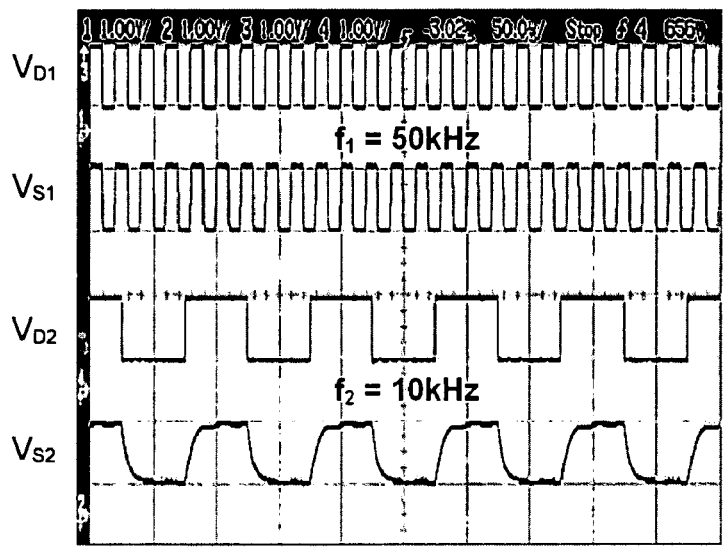
FIG. 15 shows a simultaneous signal transfer from $D_1$ to $S_1$ in lateral direction and from $D_2$ to $S_2$ in perpendicular direction.

FIG. 15 shows the simultaneous and successful transfer of a 50 kHz signal from $D_1$ to $S_1$ and a 10 kHz signal from $D_2$ to $S_2$.

Figure 16A:
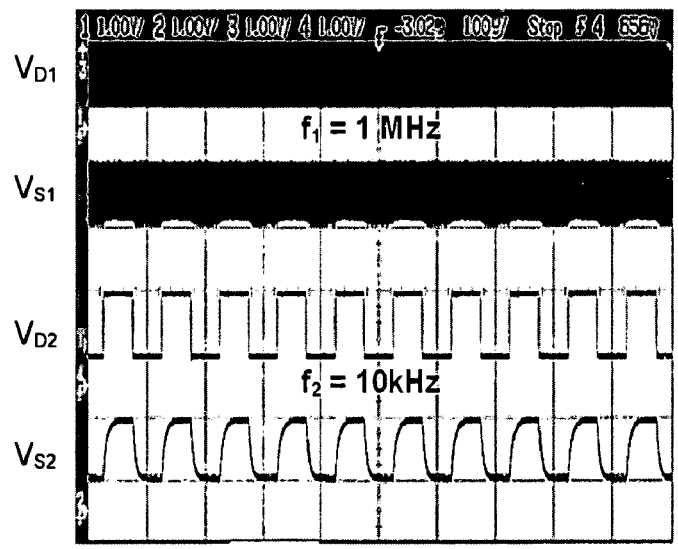
FIGS. 16A and 16B show cross-talk between the lateral and perpendicular channels: interference of $V_{D2}$ signal to channel 1 (FIG. 16A) and interference of $V_{D1}$ signal to channel 2 (FIG. 16B).
Figure 16B:
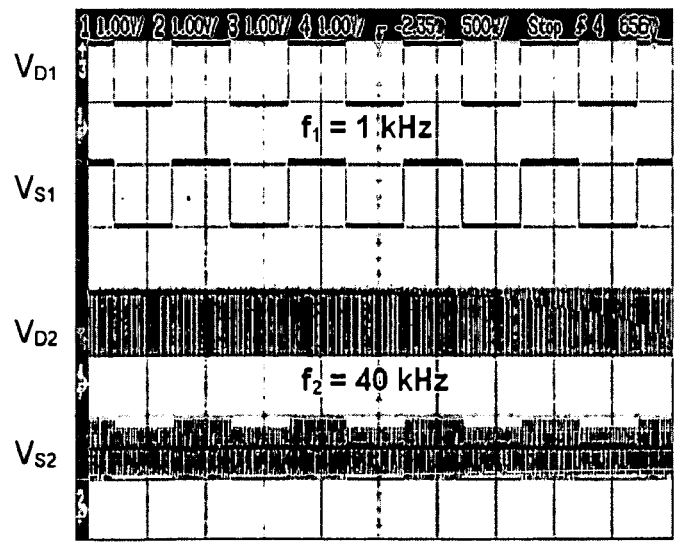

In FIGS. 16A and 16B, the interference between the two channels (cross-talk) is illustrated by applying two signals with relatively large difference in frequency. FIG. 16A shows the "notches" in 1 MHz $V_{D1}$ signal, induced by the 10 kHz $V_{D2}$ signal. Likewise a 1 kHz $V_{D1}$ square-wave affects a 40 kHz $V_{D2}$ signal in a similar way (FIG. 16B). In both cases the observed distortions are explained by the dynamic threshold voltage change of the transistor conducting the HF signal, as induced by the low-frequency signals. Note that in each case the cross-talk interference seems well within conventional noise margin levels, thus preserving each signal's information integrity.

Figure 17:
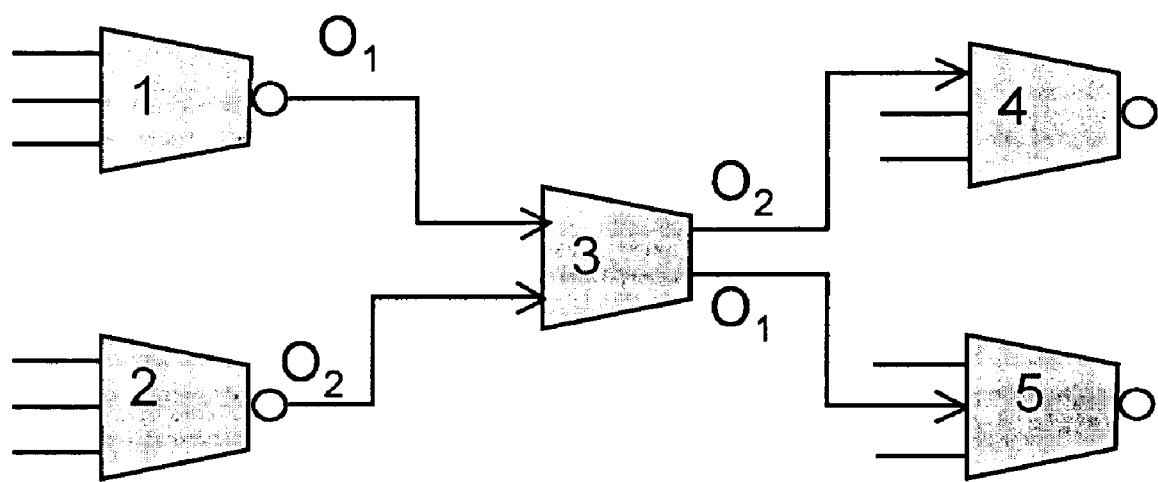
FIG. 17 shows a circuit illustrating the uniform computing and routing capability of a $G^4$-FET device.

In accordance with the teachings of the present disclosure, the $G^4$-FET device can be used both as a computing device and as a routing device, as shown, by way of example, in FIG. 17, where $G^4$-FET devices 1, 2, 3, 4 and 5 are shown. In particular, devices 1, 2, 4 and 5 are used for computation (e.g., implementation of some logic functions), while device 3 is used for data routing. Signals O1 and O2, representing the results of the computation performed by devices 1 and 2 are routed by device 3 and fed to devices 4 and 5 as input for further computation. Routing device 3 is a $G^4$-FET operating in accordance with the embodiment explained with reference to FIGS. 13-16, so that line crossing in a plane occurs.

While several illustrative embodiments of the invention have been shown and described above, numerous variations and alternative embodiments will occur to experts. Such variations and alternative embodiments are contemplated and can be made without departing from the scope of the invention as defined in the appended claims.

REFERENCES

[1] B. J. Blalock, S. Cristoloveanu, B. M. Dufrene, F. Allibert, and M. M. Mojarradi, The Multiple-Gate MOS-JFET Transistor, *Int. J. of High Speed Electronics and Systems*, 12, 2 (2002), 511-520.

[2] Cristoloveanu, B. Blalock, F. Allibert, B. M. Dufrene, and M. M. Mojarradi, The Four-Gate Transistor, *Proceedings of the 2002 European Solid-State Device Research Conf* (Firenze, Italy, September 2002). 2002, 323-326.

[3] B. Dufrene, K. Akarvardar, S. Cristoloveanu, B. J. Blalock, P. Gentil, E. Kolawa, M. M. Mojarradi, Investigation of the Four Gate Action in $G^4$-FETs, *IEEE Trans. on Electron Devices*, 51, 11 (November 2004), 1931-1935.

[4] R. Greenberg, J. JáJá, and S. Krishnamurthy, On the Difficulty of Manhattan Channel Routing, *Information Processing Letters*, vol. 44, no. 5, pp. 281-284, 1992.

[5] W. Chen (Ed.), *The VLSI Handbook*, CRC Press, 2000.

[6] N. Sherwani, *Algorithms for VLSI physical design automation*, $2^{nd}$ ed., Kluwer Academic Publishers, Assinipi Park, 1995.

[7] S. Fang, K. Chang, W. Feng, and S. Chen, Constrained via minimization with practical considerations for multi-layer VLSI/PCB routing problems, *ACM/IEEE Design Automation Conference*, pp. 60-65, 1991.

[8] M. H. Gao, S. H. Wu, J. P. Colinge, C. Claeys, and G. Declerck, "Single device inverter using SOI cross-MOSFETs," *Proc. IEEE Int. SOI Conf.*, 1991, p. 138.

What is claimed is:

1. An AND logic gate comprising:
   a first four-gate field emitter transistor (G4-FET) having three inputs and one output; and
   a second G4-FET having three inputs and one output, wherein:
   one of the inputs of the first G4-FET has a low logic value;
   a first input of the second G4-FET has a logic value which is opposite to a logic value of
   a second input of the second G4-FET; and
   a third input of the second G4-FET is connected to the output of the first G4-FET.

2. An OR logic gate comprising:
   a first four-gate field emitter transistor (G4-FET) having three inputs and one output; and
   a second G4-FET having three inputs and one output, wherein:
   one of the inputs of the first G4-FET has a high logic value;
   a first input of the second G4-FET has a logic value which is opposite to a logic value of
   a second input of the second G4-FET; and
   a third input of the second G4-FET is connected to the output of the first G4-FET.

3. A four-gate field emitter transistor (G4-FET) having three inputs and one output, wherein one of the inputs acts as a control bit to generate a programmable 2-bit gate and wherein:
   when said one of the inputs has a low logic value the output is an inverse of an AND of the other two inputs; and
   when said one of the inputs has a high logic value the output is an inverse of an OR of the other two inputs.

* * * * *